United States Patent
Laighton et al.

(10) Patent No.: US 10,158,156 B2
(45) Date of Patent: Dec. 18, 2018

(54) MICROWAVE TRANSMISSION LINE HAVING A 3-D SHIELDING WITH A LATERALLY SEPARATED REGION

(71) Applicant: Raytheon Company, Waltham, MA (US)

(72) Inventors: Christopher M. Laighton, Boxborough, MA (US); Edward A. Watters, Carlisle, MA (US); Keith R. Kessler, Andover, MA (US)

(73) Assignee: Raytheon Company, Waltham, MA (US)

( * ) Notice: Subject to any disclaimer, the term of this patent is extended or adjusted under 35 U.S.C. 154(b) by 235 days.

(21) Appl. No.: 15/187,219

(22) Filed: Jun. 20, 2016

(65) Prior Publication Data

US 2018/0131066 A1 May 10, 2018

(51) Int. Cl.
*H01P 3/00* (2006.01)
*H01P 11/00* (2006.01)
*H05K 1/02* (2006.01)

(52) U.S. Cl.
CPC .............. *H01P 3/003* (2013.01); *H01P 3/006* (2013.01); *H01P 11/003* (2013.01); *H05K 1/0219* (2013.01); *H05K 2201/0715* (2013.01)

(58) Field of Classification Search
CPC ................................. H01P 3/003; H01P 3/006
USPC ......................................................... 333/238
See application file for complete search history.

(56) References Cited

U.S. PATENT DOCUMENTS

| 5,194,833 A * | 3/1993 | Dougherty et al. .... H01P 3/003 333/246 |
| 6,674,347 B1 * | 1/2004 | Maruhashi et al. .... H01P 3/003 333/161 |
| 6,762,494 B1 * | 7/2004 | Fazelpour et al. .......................... H01L 23/49838 257/259 |
| 2005/0248001 A1 | 11/2005 | Joodaki |
| 2009/0255720 A1 | 10/2009 | Lu et al. |
| 2010/0079222 A1 * | 4/2010 | Makita .................... H01L 23/66 333/238 |
| 2013/0154773 A1 | 6/2013 | Spirak |
| 2014/0264287 A1 | 9/2014 | Abraham et al. |
| 2016/0197391 A1 * | 7/2016 | Li et al. ................. H01P 3/003 333/208 |

OTHER PUBLICATIONS

Notification of Transmittal of the International Search Report and the Written Opinion of the International Searching Authority, or the Declaration, PCT/US2017/037164, dated Sep. 20, 2017, 1 page.

(Continued)

*Primary Examiner* — Benny Lee
(74) *Attorney, Agent, or Firm* — Daly, Crowley, Mofford & Durkee, LLP

(57) ABSTRACT

A microwave transmission line having a coplanar waveguide and a pair of conductive members, each one of the pair of conductive members having a proximal end disposed on a portion of a corresponding one of a pair of ground plane conductors of the coplanar waveguide and a distal end disposed over, and vertically spaced from, a region between a center conductor of the coplanar waveguide and a corresponding one of the pair of ground plane conductors of the coplanar waveguide. The distal ends are laterally separated from each other by a region disposed over the center conductor.

7 Claims, 6 Drawing Sheets

(56) References Cited

OTHER PUBLICATIONS

International Search Report, PCT/US2017/037164, dated Sep. 20, 2017, 4 pages.
Written Opinion of the International Searching Authority, PCT/US2017/037164, dated Sep. 20, 2017, 9 pages.

* cited by examiner

*FIG. 3A*
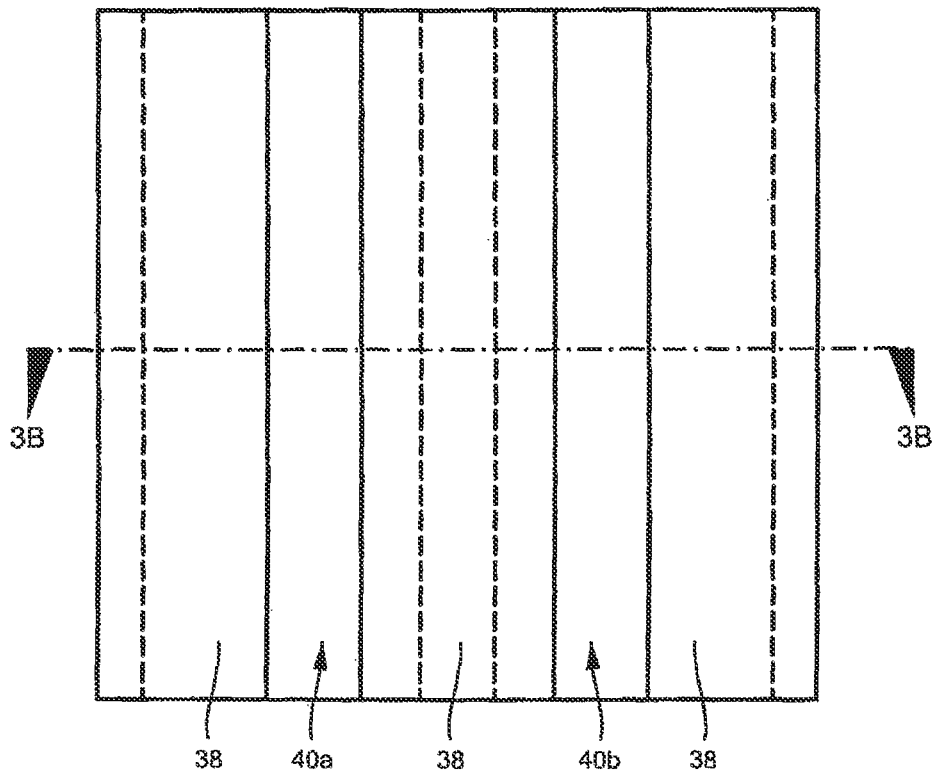
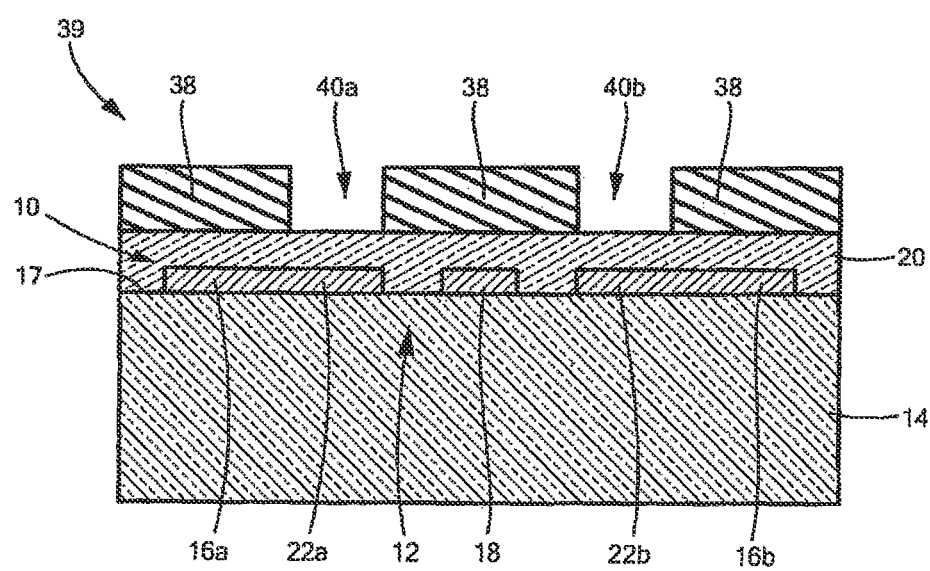
*FIG. 3B*

MICROWAVE TRANSMISSION LINE HAVING A 3-D SHIELDING WITH A LATERALLY SEPARATED REGION

STATEMENT REGARDING FEDERALLY SPONSORED RESEARCH

The subject matter of the present invention was made with government support under Contract No. N00024-13-c-5230 awarded by the United States Navy. The government has certain rights in the invention.

TECHNICAL FIELD

This disclosure relates generally to Monolithic Microwave Integrated Circuits (MMICs) having a plurality of proximate microwave transmission lines and more particularly to MMICs having reduced electromagnetic coupling between such microwave transmission lines.

BACKGROUND OF THE INVENTION

As is known in the art, MMICs include a plurality of microwave transmission lines in close proximity one to another. A portion of one MMIC with a coplanar waveguides transmission line (CPW) and an adjacent microstrip transmission line is shown in FIGS. 1A and 1B; here shown with a scratch resistant dielectric layer over the transmission lines, as shown. More particularly, if the electrical isolation between two transmission lines is not greater than typically 20 dB more than the difference in the signal levels carried by the two transmission lines can result in unwanted feedback between the two transmission lines. One method used to solve this problem is to separate the center conductor of the microstrip transmission line from the outer edge of the proximate ground plane conductor of the CPW a distance D (FIG. 1B) sufficient to provide the requisite electrical isolation between the CPW and the microstrip transmission line. However such techniques use valuable surface area for the pair of transmission lines

SUMMARY OF THE INVENTION

In accordance with the disclosure, a microwave transmission line is provided having a coplanar waveguide (CPW) and a pair of conductive members. Each one of the pair of conductive members has a proximal end disposed on a portion of a corresponding one of the pair of ground plane conductors of the coplanar waveguide and a distal end disposed over, and vertically spaced from, a region between a center conductor of the coplanar waveguide and a corresponding one of the pair of ground plane conductors. The distal ends are laterally separated from each other by a region disposed over the center conductor.

With such an arrangement the conductive members provide shielding between the microwave transmission line and any proximate microwave transmission lines of a MMIC with less separation being required between the transmission lines than between transmission lines without such pair of conductive members thereby increasing the amount of surface area available for other devices on the MMIC.

In one embodiment, a microwave transmission line, is provided having a coplanar waveguide, comprising: a substrate; a pair of ground plane conductors disposed on a surface of the substrate; and a strip conductor disposed on the surface between the pair of ground plane conductors. A pair of conductive members is included, each one of the pair of conductive members having a proximal end disposed a portion of a corresponding one of the pair of ground plane conductors and each one of the pair of conductive members having a distal end disposed over, and vertically spaced from, a region between the center conductor and a corresponding one of the pair of ground plane conductors, the distal ends of the pair of conductive members being laterally separated from each other by a region disposed over the center conductor.

In one embodiment, the microwave transmission line includes a scratch resistant, dielectric protective coating disposed over the center conductor and over first portions of the pair of ground plane conductors, the protective coating having a pair of openings therethrough, each one of the opening exposing a second portion of a corresponding one of the pair of ground plane conductors and wherein the proximal ends of the pair of conductor members pass through the openings onto the pair of ground plane conductors.

With such an arrangement, additional patterning of existing scratch resistant protection coating dielectric material enables formation of the pair of conductive members having vertical walls with overhang to confining electric fields in the waveguide and greatly increasing isolation to surrounding circuitry. The ground plane conductors of the CPW are left exposed so that conductive material can be deposited in the opening formed in the scratch protective layer. Further, patterning of the scratch resistant protective layer enables for nation of a 3-dimensional aspect to radio frequency (RF) shielding around a signal passing through the center conductor of the CPW transmission line.

In one embodiment, a microwave transmission line is provided having a coplanar waveguide, comprising: a substrate; a pair of ground plane conductors disposed on a surface of the substrate; a strip conductor disposed on the surface between the pair of ground plane conductors; a protective coating disposed over the center conductor and over first portions of the pair of ground plane conductors, the protective coating having a pair of openings therethrough, each one of the opening exposing a second portion of a corresponding one of the pair of ground plane conductors: and a pair of conductive members, each one of the pair of conductive members having a proximal end disposed on the second portion of a corresponding one of the pair of ground plane conductors and each one of the pair of conductive members having a distal end disposed on a corresponding one of a pair of laterally spaced, upper surface portions of the protective coating, the distal ends of the pair of conductive members being laterally separated from each other by region disposed over the center conductor.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIGS. 3A and 3B, FIG. 4A and FIG. 4B and FIGS. 5A and 5B are plan and cross-sectional sketches, respectively, of the microwave transmission line of FIGS. 2A and 2B showing various stages in the fabrication thereof according to the disclosure, the cross sectional sketch being taken along lines 3A-3B, 4B-4B, and 5B-5B, respectively in FIGS. 3A, 3B and 3C, respectively.

DETAILED DESCRIPTION OF THE INVENTION

Figure 1A:
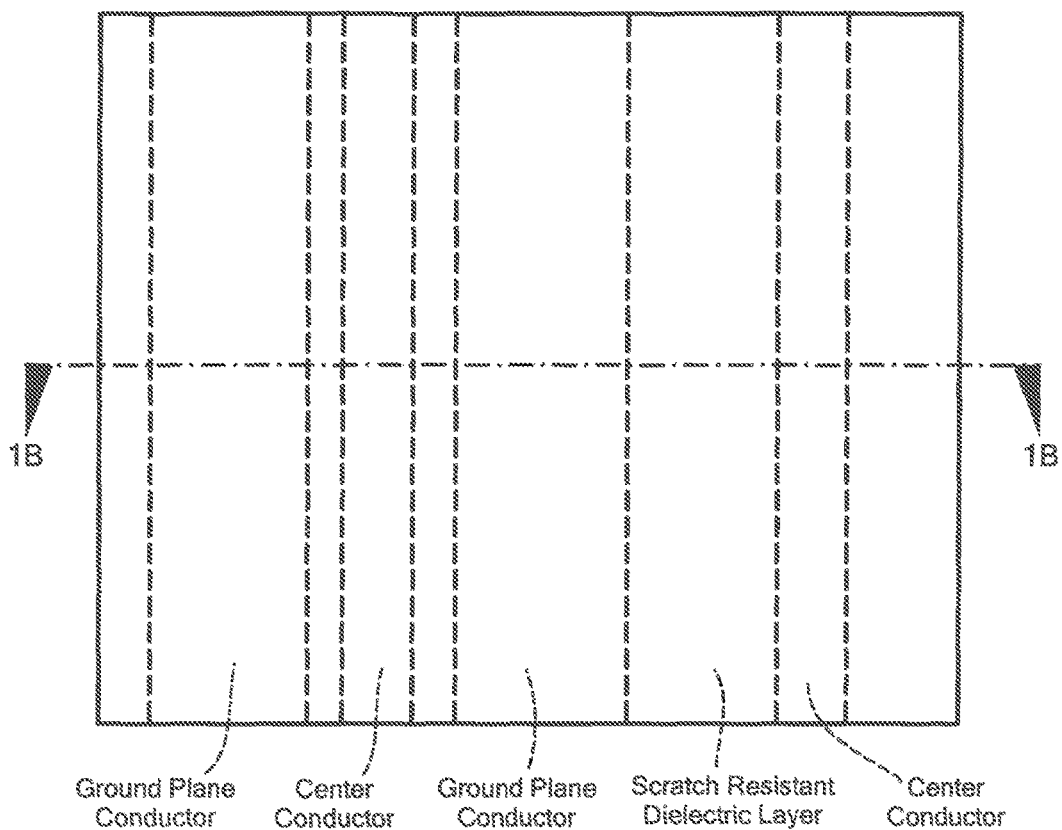
FIGS. 1A and 1B are plan and cross-sectional sketches, respectively, of portion of an MMIC having a coplanar waveguide and a proximate microstrip transmission line according to the PRIOR ART, the cross sectional sketch being taken along line 1B-1B in FIG. 1A.
Figure 1B:
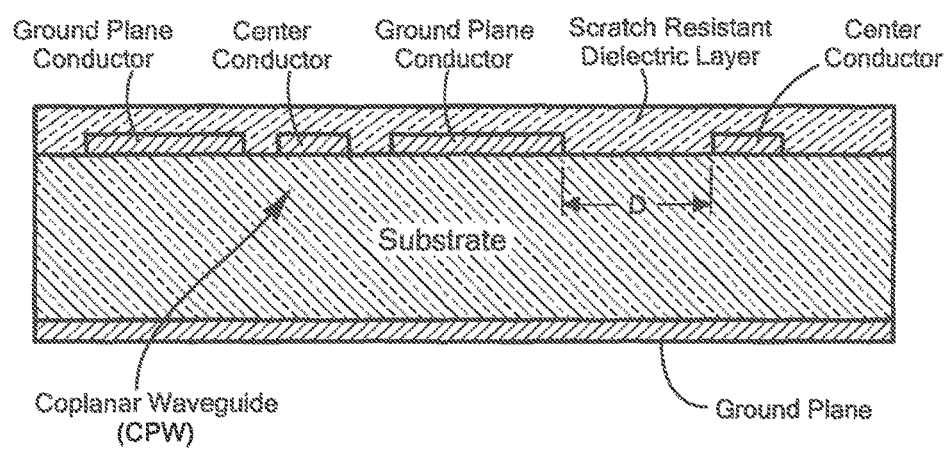
Figure 2A:
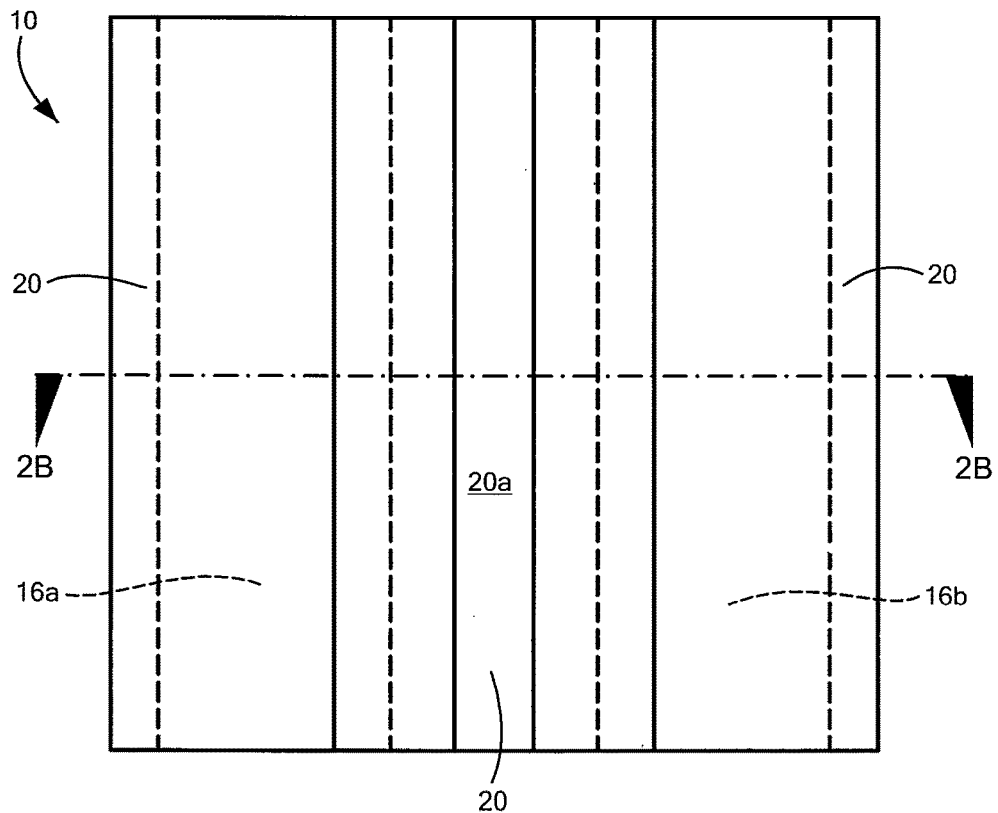
FIGS. 2A and 2B are plan and cross-sectional sketches, respectively, of portion of a microwave transmission line according to the disclosure, the cross sectional sketch being taken along line 2B-2B in FIG. 2A.
Figure 2B:
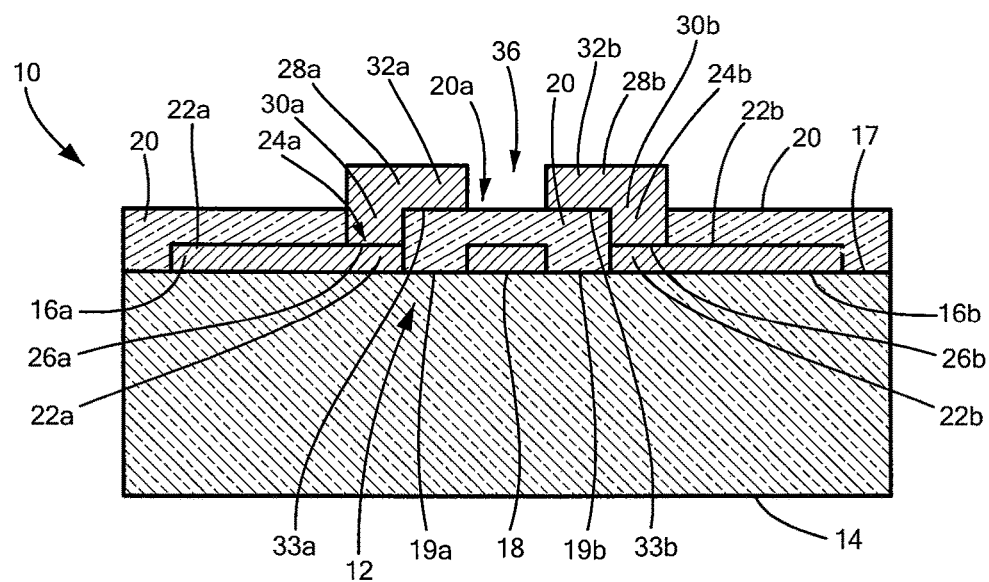

Referring now to FIGS. 2A and 2B, a microwave transmission line 10 is shown having a coplanar waveguide (CPW) 12 (FIG. 2B). The coplanar waveguide 12 (FIG. 2B) includes: a substrate 14 (FIG. 2B); a pair of ground plane conductors 16a, 16b disposed on an upper surface 17 (FIG. 2B) of the substrate 14 (FIG. 2B); a strip center conductor 18 (FIG. 2B) disposed on the surface of the substrate 14 (FIG. 2B) between the pair, of ground plane conductors 16a, 16b. Here, for example, the ground plane conductors 16a, 16b and the center conductor 18 are gold having a thickness in a range from 4 to 9 um.

A dielectric scratch resistant protective coating 20 is disposed over the upper surface 17 of the substrate 14 over the center conductor 18, over the spaces 19a, 19b (FIG. 2B) between the center conductor 18 and the ground plane conductors 16a, 16b and over first portions 22a, 22b of the pair of ground plane conductors 16a, 16b, as shown in FIG. 2B. Here, the protective coating is Benzocyclobutene (BCB) having a thickness in, a range of 4 to 12 um. The protective coating 20 has a pair of openings 24a, 24b therethrough. Each one of the opening 24a, 24b exposes a second portion 26a, 26b of a corresponding one of the pair of ground plane conductors 16a, 16b, respectively as shown in FIG. 2B.

As shown in FIG. 2B, a pair of conductive members 28a, 28b is included. Here, for example, each one of the conductive members 28a, 28b is gold. Each one of the pair of conductive members 28a, 28b has a proximal end 30a, 30b, respectively, disposed on the second portions 26a, 26b respectively of a corresponding one of the pair of pound plane conductors 16a, 16b, as shown. Each one of the pair of conductive members 16a, 16b, has a distal end 32a, 32b, respectively, disposed on a corresponding one of a pair of laterally spaced, upper surface portions 33a, 33b of the dielectric, scratch resistant protective coating 20, as shown. The distal ends 32, 32b of the pair of conductive members 28a, 28b are laterally separated from each other by region 36, here air, disposed over the center conductor 18. It is noted that the region 36 is separated from the center conductor 18 by a portion 20a (FIGS. 2A and 2B) of the dielectric, scratch resistant protective coating 20, as shown.

Referring now to FIGS. 3A and 3B, a method used to form the microwave transmission line 10 (FIG. 3B) is shown; it being understood that other methods may be used. Thus, as shown in FIG. 3B the upper surface 17 of the substrate 14, here for example, a dielectric or semi-insulating substrate, such as is used in a MMIC, has formed thereon, using any conventional photolithographic-etching processes, the coplanar waveguide 12. Here, for example, the ground plane conductors 16a, 16b and the strip center conductor 18 have thicknesses in the range of 4 to 9 um. The scratch resistant protective dielectric layer 20, such as BCB having a thickness in the range of 4 to 12 um is deposited over the center conductor 18, over the spaces 19a, 19b (FIG. 5B) between the center conductor 18 and the ground plane conductors 16a, 16b and over the ground plane conductors 16a, as shown in FIG. 3B. A layer 38 of photoresist in deposited over the scratch resistant protective dielectric layer 20, as shown, here the thickness of the scratch resistant protective dielectric layer is in a range of 4 to 12 um. The layer 38 of photoresist is patterned using conventional lithography to form a mask 39 (FIG. 3B), here having a pair of windows 40a, 40b therein, as shown. Each one of the windows 40a, 40b exposes underlying portions of the scratch resistant protective dielectric layer 20 disposed over the second portions 22a, 22b, (FIG. 3B) of a corresponding one of the pair of ground plane conductors 16a, 16b, respectively, as shown in FIG. 3B.

Figure 4A:
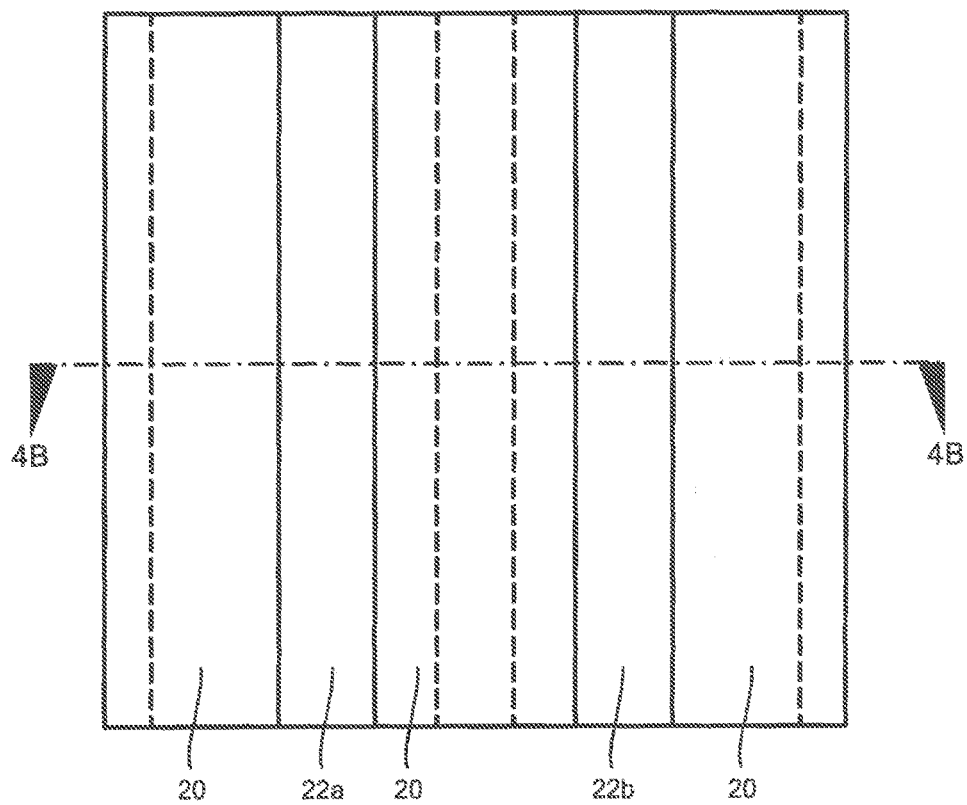
Figure 4B:
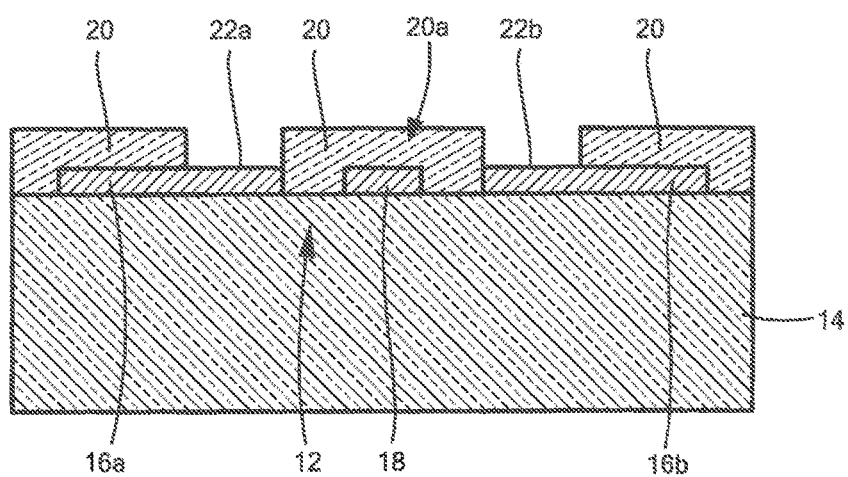

Referring now also to FIGS. 4A and 4B, the upper surface of the mask 39 (FIG. 3B) is exposed to a suitable dry or wet etchant to remove exposed portions of scratch resistant protective dielectric layer 20 disposed over the second portions 22a, 22b (FIGS. 4A and 4B) of a corresponding one of the pair of ground plane conductors 16a, 16b (FIG. 4B), respectively, as shown.

Figure 5A:
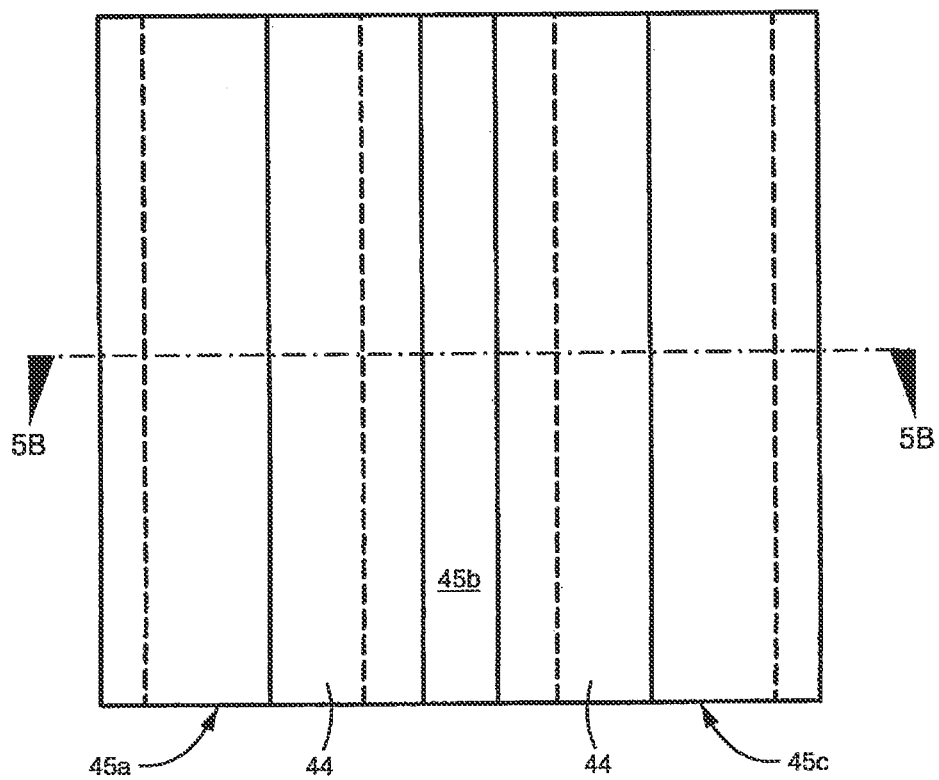
Figure 5B:
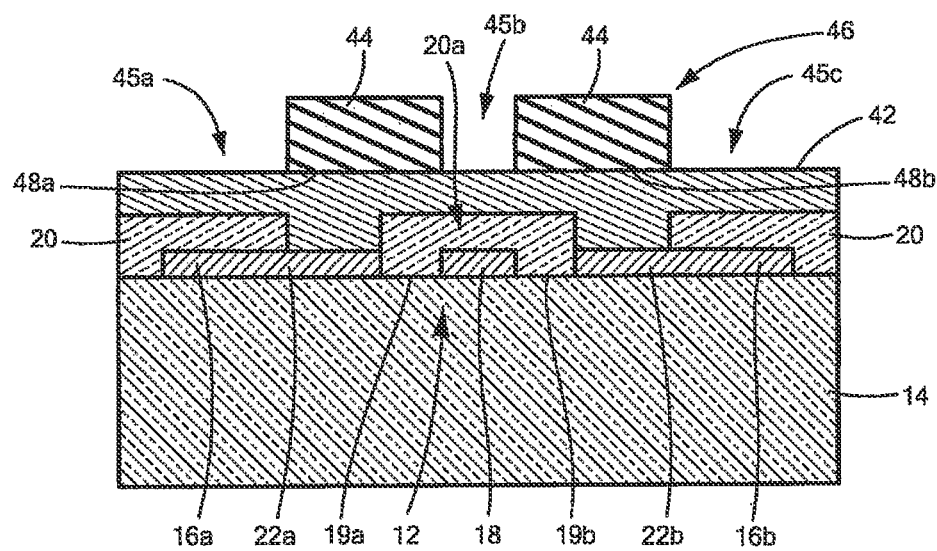

The mask 39 (FIG. 3B) is removed and a conductive layer 42, here, for example, gold, here, for example, having an upper thickness in a range of from 4 to 9 um is desposed over the upper surface of the structure; portions of the conductive layer 42 being deposited on the scratch resistant protective dielectric layer 20 and other portions passing onto the second portions 22a, 22b of the pair of ground plane conductors 16a, 16b, as shown in FIG. 5B. A layer 44 of photoresist is deposited over the conductive layer 42 and patterned into a mask 46 (FIG. 5B) having openings 45a, 45b, and 45c therein, as shown in FIGS. 5A and 5B. It is noted that the mask 46 (FIG. 5B) covers two regions 48a, 48b (FIG. 5B); one region 48a being disposed over the second portion 22a, of a first one of the pair of ground plane conductors 16a and extending laterally over space 19a between an adjacent outer edge of the ground plane conductors 16a and an outer edge of the center conductor 18 adjacent ground plane conductors 16a; and the other one of the two regions 48b being disposed over the second portion 22b of the ground plane conductors 16b and extending laterally over the space 19b between an adjacent outer edge the ground plane conductors 16b and an outer edge of the center conductor 18 adjacent to the ground plane conductors 16b, as shown in FIG. 5B. The mask 46 is exposed to suitable dry, or wet etch to remove the unmasked portions of the conductive layer 42. The mask 46 (FIG. 5B) is removed forming, the microwave transmission line 10 shown in FIGS. 2A and 2B.

Figure 6:
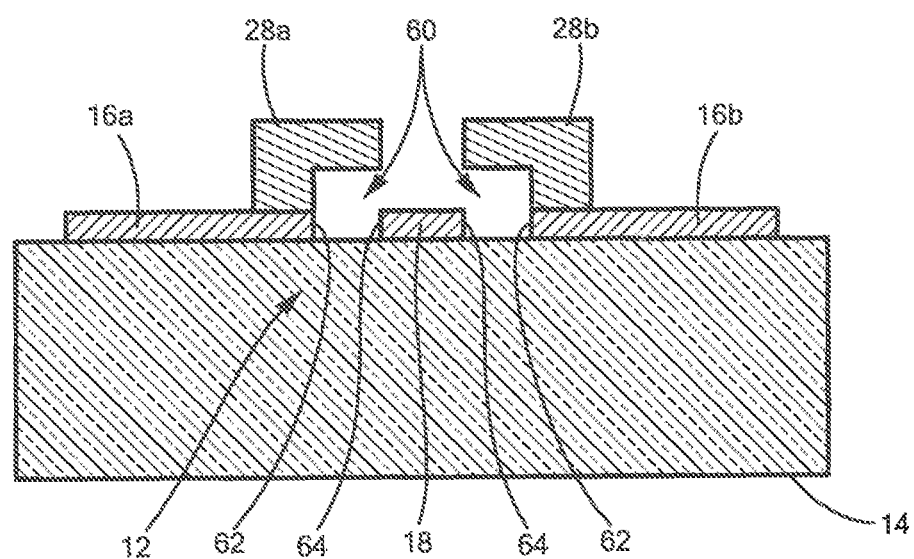
FIG. 6 is a cross sectional diagrammatical sketch of a microwave transmission line according to anther embodiment of the disclosure Like reference symbols in the various drawings indicate like elements.

A number of embodiments of the disclosure have been described. Nevertheless, it will be understood that various modifications may be made without departing from the spirit and scope of the disclosure. For example, the microwave transmission line 10 may be formed without scratch resistant protective; that is with the distal ends of the conductive members 28a, 28b suspended over the air-filled regions 60 between the outer edges of the ground plane conductors 62 and the outer edges 64 of the center conductor as by etching away the solid dielectric, as shown in FIG. 6. Accordingly, other embodiments are within the scope of the following claims.

What is claimed is:

1. A microwave transmission line, comprising:
a coplanar waveguide (CPW) having a center conductor disposed between a pair of ground plane conductors disposed on a surface of a substrate; and
a pair of dielectrically separated conductive members disposed on a corresponding one of the pair of ground plane conductors, each one of the pair of dielectrically separated conductive members comprising:
  a vertical portion having a first end region disposed on, and electrically connected to, a portion of the corresponding one of the pair of ground plane conductors; and
  a horizontal portion having a first portion disposed vertically over, and electrically connected to, a second end region of the corresponding vertical portion, the horizontal portion projecting horizontally from the first end portion of the horizontal portion to a second end portion of the horizontal portion, the horizontal portion being disposed over, and vertically spaced from, a region between the center conductor and the corresponding one of the pair of ground plane conductors; and
  wherein the end portions of the corresponding horizontal portions being laterally separated from each other by a region disposed over the center conductor.

2. The microwave transmission line recited in claim 1 including a dielectric disposed over the center conductor, over portions of the pair of ground plane conductors, and in regions disposed under the second end portion of the corresponding horizontal portions.

3. The microwave transmission line recited in claim 1 including a scratch resistant protective layer, the scratch resistant protective layer having a pair of openings therethrough, each one of the pair of openings exposing a second portion of a corresponding one of the pair of ground plane conductors and wherein the second end portions of the vertical portion of the pair of conductor members pass through the openings onto the corresponding pair of ground plane conductors.

4. A microwave transmission line, comprising:
a coplanar waveguide, comprising: a substrate; a pair of ground plane conductors disposed on a surface of the substrate; a strip conductor disposed on the surface of the substrate between the pair of ground plane conductors;
a protective, dielectric coating disposed over the center conductor and over first portions of the pair of ground plane conductors, the protective coating having a pair of openings therethrough, each one of the pair of openings exposing a second portion of a corresponding one of the pair of ground plane conductors: and
a pair of conductive members dielectrically separated by portions of the protective, dielectric coating, each one of the pair of conductive members comprising:
  a vertical portion passing through a corresponding one of the pair of openings and disposed on the second portion of the corresponding one of the pair of ground plane conductors; and
  a horizontal portion having one end disposed vertically over, and on, the corresponding vertical portion; and
  wherein the horizontal portion is disposed over, and vertically spaced from, a region between the center conductor and the corresponding one of the pair of ground plane conductors; and
  wherein ends of the corresponding horizontal portions of the pair of conductive members being laterally separated from each other by a region disposed over the center conductor.

5. A microwave transmission line section, comprising:
a coplanar waveguide (CPW) comprising a center conductor disposed between a pair of ground plane conductors disposed on a surface of a substrate, the center conductor and the pair of ground plane conductors extending from a first end on the microwave transmission line section to a second end of the microwave transmission line section; and
a pair of conductive members, each one of the pair of conductive members comprising:
  a lower, vertical portion having a bottom portion disposed on, and electrically connected to, a corresponding one of the pair of ground plane conductors, the lower, vertical portion extending continuously from the first end of the microwave transmission line section to the second end of the microwave transmission line; and
  an upper, horizontal portion extending continuously from the first end of the microwave transmission line section to the second end of the microwave transmission line and extending continuously from an upper portion of the corresponding lower, vertical portion to an end portion of the upper, horizontal portion;
  wherein the upper, horizontal portion is disposed over, and vertically spaced from, a region between the center conductor and the corresponding one of the pair of ground plane conductors; and
wherein the end portions of the corresponding upper, horizontal portions are laterally separated from each other by a region disposed over the center conductor.

6. A microwave transmission line, comprising:
a coplanar waveguide (CPW) comprising a center conductor disposed between a pair of ground plane conductors disposed on a surface of a substrate; and
a pair of conductive members, each one of the pair of conductive members comprising:
  a vertical portion having a first end region disposed on a portion of a corresponding one of the pair of ground plane conductors;
  a horizontal portion having a first portion disposed vertically over, and connected to, a second end region of the corresponding vertical portion, the horizontal portion projecting horizontally from the first end portion of the horizontal portion to an second end portion of the horizontal portion, the horizontal portion being disposed over, and vertically spaced from, a region between the center conductor and the corresponding one of the pair of ground plane conductors; and
wherein the second end portions of the corresponding horizontal portions being laterally separated from each other by a region disposed over the center conductor.

7. A microwave transmission line section, comprising:
a coplanar waveguide (CPW) comprising a center conductor disposed between a pair of ground plane conductors disposed on a surface of a substrate; and
a pair of conductive members, a first one of the pair of conductive members being dielectrically separated from a second one of the pair of conductive members, each one of the pair of conductive members comprising:

a lower, vertical portion having a bottom portion disposed on, and electrically connected to, a corresponding one of the pair of ground plane conductors; and an upper, horizontal portion, the upper, horizontal portion extending horizontally from an upper portion of the corresponding lower, vertical portion to an end portion of the upper, horizontal portion;

wherein the upper, horizontal portion is disposed over, and vertically spaced from, a region between the center conductor and the corresponding one of the pair of ground plane conductors; and wherein the end portions of the corresponding upper, horizontal portions are laterally separated from each other by a region disposed over the center conductor.

* * * * *